(12) United States Patent
Leung et al.

(10) Patent No.: US 7,703,945 B2
(45) Date of Patent: Apr. 27, 2010

(54) EFFICIENT EMITTING LED PACKAGE AND METHOD FOR EFFICIENTLY EMITTING LIGHT

(75) Inventors: Michael Leung, Ventura, CA (US); Keller Bernd, Santa Barbara, CA (US); Ibbetson James, Santa Barbara, CA (US); Tarsa Eric, Goleta, CA (US)

(73) Assignee: Cree, Inc., Goleta, CA (US)

( * ) Notice: Subject to any disclaimer, the term of this patent is extended or adjusted under 35 U.S.C. 154(b) by 83 days.

(21) Appl. No.: 11/476,520

(22) Filed: Jun. 27, 2006

(65) Prior Publication Data
US 2007/0297179 A1    Dec. 27, 2007

(51) Int. Cl.
*F21V 5/00* (2006.01)
*H01J 1/62* (2006.01)
*H01L 29/18* (2006.01)

(52) U.S. Cl. .................... 362/246; 362/231; 362/84; 313/512; 257/98

(58) Field of Classification Search .................. 362/84, 362/231, 246, 800; 257/98, 100; 313/511–512
See application file for complete search history.

(56) References Cited

U.S. PATENT DOCUMENTS

| | | | | |
|---|---|---|---|---|
| 5,813,753 | A | 9/1998 | Vriens et al. | 362/293 |
| 5,959,316 | A | 9/1999 | Lowery | 257/98 |
| 6,578,998 | B2 * | 6/2003 | Zhang | 362/555 |
| 6,641,287 | B2 * | 11/2003 | Suehiro | 362/298 |
| 6,737,681 | B2 * | 5/2004 | Koda | 257/98 |
| 6,994,453 | B2 | 2/2006 | Blanchard | 362/293 |
| 7,246,917 | B2 * | 7/2007 | Rhoads et al. | 362/241 |
| 7,293,908 | B2 * | 11/2007 | Beeson et al. | 362/612 |
| 2003/0038295 | A1 | 2/2003 | Koda | |
| 2004/0041222 | A1 | 3/2004 | Loh | |
| 2005/0236628 | A1 | 10/2005 | Matsuura | |
| 2006/0034084 | A1 * | 2/2006 | Matsuura et al. | 362/293 |

FOREIGN PATENT DOCUMENTS

| | | |
|---|---|---|
| EP | 1198016 A2 | 10/2001 |
| WO | WO2005055328 A1 | 6/2005 |
| WO | WO2005078338 A1 | 8/2005 |

OTHER PUBLICATIONS

Nichia Corp. White LED, Part No. NSPW312BX, "Specifications for Nichia White LED, Model NSW312BS", pp. 1-14, 2004.
Nichia Corp. White LED, Part No. NSPW300BS, "Specifications for Nichia White LED Model NSPW300BS", pp. 1-14, 2004.
PCT Search Report Nov. 20, 2007, Written Opinion.

* cited by examiner

*Primary Examiner*—Ali Alavi
(74) *Attorney, Agent, or Firm*—Koppel, Patrick, Heybl & Dawson

(57) ABSTRACT

An LED package comprises an LED for emitting LED light, and a conversion material remote to said LED for down-converting the wavelength of LED light. The package further comprises a reflector directing at least some of the LED light toward the conversion material, the conversion material down-converting the wavelength of at least some of the reflected LED light. A method for emitting light from an LED package comprising providing an LED, reflector and conversion material, and emitting light from said LED, at least some of the LED light emitted toward the reflector. The method further comprises reflecting at least some of the LED light toward the conversion material, and converting at least some of said reflected LED light at the conversion material. At least some of the converted reflected LED light is emitted by the LED package.

46 Claims, 4 Drawing Sheets

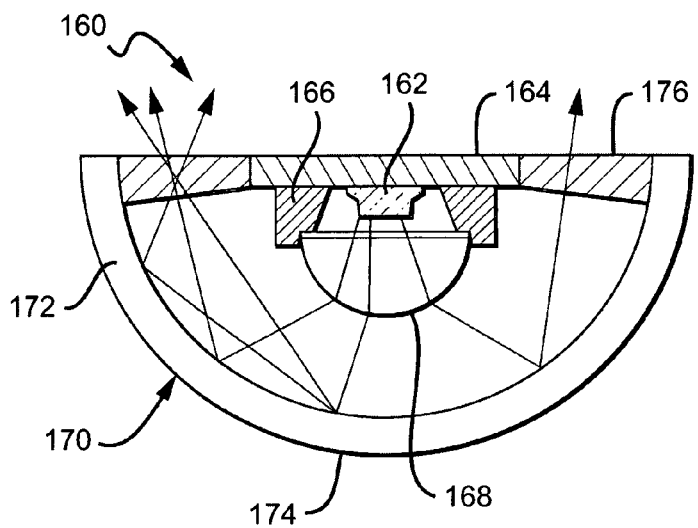
FIG. 6
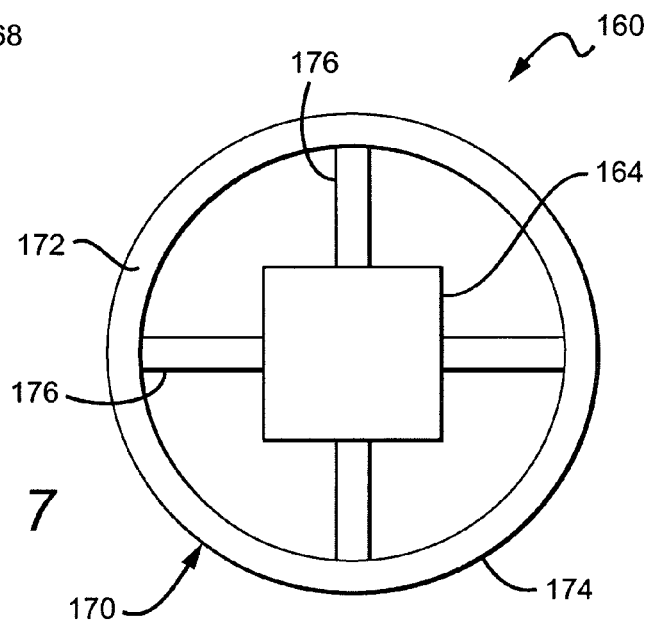
FIG. 7
FIG. 8
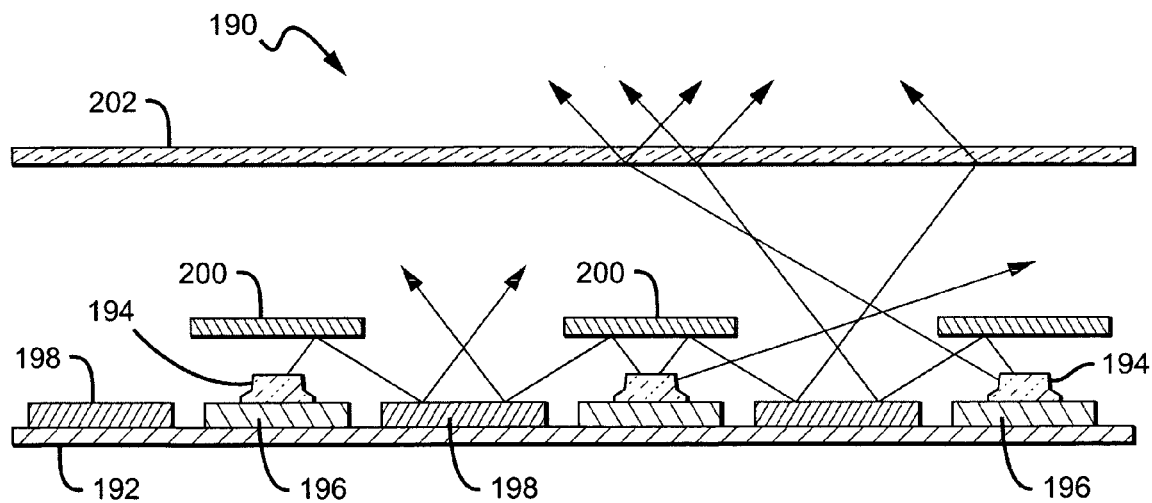

EFFICIENT EMITTING LED PACKAGE AND METHOD FOR EFFICIENTLY EMITTING LIGHT

BACKGROUND OF THE INVENTION

1. Field of the Invention

This invention relates to light emitting diodes and more particularly to a light emitting diode apparatus and method for efficiently generating light from a wavelength down-conversion material.

2. Description of the Related Art

Light emitting diodes (LED or LEDs) are solid state devices that convert electric energy to light and generally comprise an active region of semiconductor material sandwiched between two oppositely doped layers of semiconductor material. When a bias is applied across the doped layers, holes and electrons are injected into the active region where they recombine to generate light. Light is emitted from the active layer and from all surfaces of the LED. Recent advances in LEDs (such as nitride based LEDs) have resulted in highly efficient light sources that surpass the efficiency of filament based light sources while providing a light with equal or greater brightness in relation to its input power.

One disadvantage of conventional LEDs used for lighting applications is that they cannot generate white light from their active layers. One way to produce white light from conventional LEDs is to combine different colors from different LEDs. For example, white light can be produced by combining the light from red, green and blue LEDs or combining the light from blue and yellow LEDs. One disadvantage of this approach is that it requires the use of multiple LEDs to produce a single color of light, increasing the overall cost and complexity. Different colors of light are also often generated from different types of LEDs, and combining different LED types on one device can require complex fabrication and can require different control voltages. These types of emitters are complicated and costly to manufacture since each device may have different electrical requirements and may behave differently under varied operating conditions (e.g. with temperature, current or time).

The spectral emission lines of component LEDs are typically narrow (e.g. 10-30 nm FWHM) and wavelength ranges exist in which it is difficult to obtain high-efficiency LEDs (e.g. approximately 550 nm). As a result, it may be difficult to achieve both high efficacy and high color rendering index with low cost and high yield. This can be particularly problematic when spectral requirements call for high efficiency green LEDs, since such LEDs have only been realized in the (In, Ga, Al)N system and are typically subject to low efficiency and wavelength and emission variations with operating conditions such as drive current and temperature. While more simplified white lamps may be realized using only two LEDs emitting at complimentary colors (e.g. blue, yellow), it is exceedingly difficult to achieve high color rendering coefficients in such lamps.

Light from a single blue emitting LED has also been converted to white light by surrounding the LED chip with a yellow phosphor, polymer or dye, with a typical phosphor being Ce:YAG. [See Nichia Corp. white LED, Part No. NSPW300BS, NSPW312BS, etc.; See also U.S. Pat. No. 5,959,316 to Lowrey, "Multiple Encapsulation of Phosphor-LED Devices"]. The surrounding material "down-converts" the wavelength of at least some of the LED light, changing its color. For example, if a nitride based blue emitting LED is surrounded by a yellow phosphor, some of the blue light will pass through the phosphor without being changed, while the remaining light will be down-converted to yellow. The LED will emit both blue and yellow light, which combines to provide a white light.

One conventional method for coating an LED with a phosphor layer utilizes a syringe or nozzle for injecting a phosphor containing epoxy over the LED. Another conventional method for coating an LED is by stencil printing, which is described in European Patent Application EP 1198016 A2 to Lowery. Multiple light emitting semiconductor devices are arranged on a substrate with a desired distance between adjacent LEDs. The stencil is provided having openings that align with the LEDs, with the holes being slightly larger than the LEDs and the stencil being thicker than the LEDs. A stencil is positioned on the substrate with each of the LEDs located within a respective opening in the stencil. A composition is then deposited in the stencil openings, covering the LEDs, with a typical composition being a phosphor in a silicone polymer that can be cured by heat or light. After the holes are filled, the stencil is removed from the substrate and the stenciling composition is cured to a solid state.

Another conventional method for coating LEDs with a phosphor utilizes electrophoretic deposition. The conversion material particles are suspended in an electrolyte based solution. A plurality of LEDs are arranged on a conductive substrate that is then almost completely immersed in the electrolyte solution. One electrode from a power source is coupled to the conductive substrate at a location that is not immersed in the solution, and the other electrode is arranged in the electrolyte solution. The bias from the power source is applied across the electrodes, which causes current to pass through the solution to the substrate and its LEDs. This creates an electric field that causes the conversion material to be drawn to the LEDs, covering the LEDs with the conversion material.

In these conventional LED packages the phosphor conversion elements are in close proximity to the LED chip, and due to scattering and Lambertian emission characteristics of phosphors, a significant portion of the light is emitted back into the LED package and LED chip. Upon transmission through the phosphor layer, photons can also experience multiple scattering events. Light, which is scattered or emitted by the phosphor layer and directed toward the LED chip, is subject to the light extraction limitations of the chip. The LED chip light extraction efficiency is typically less than unity, resulting in further photon losses. Light that is scattered back into the package can be reflected back, but the reflectivity of package materials is typically only 70-90%. The scattering and back emission increases the path length for the emitted light within the package and thus the chance to experience losses.

SUMMARY OF THE INVENTION

Briefly, and in general terms, the invention is directed to emitter packages and methods for emitting light, and in particular LED packages and methods for emitting light from LED packages. One embodiment of an emitter package according to the present invention comprises a primary emitter emitting light, and conversion material remote to said primary emitter capable of converting the wavelength of said emitter light. The package further comprises a reflector reflecting at least some of the emitter light toward the conversion material, the wavelength of at least some of the reflected light converted by the conversion material.

An embodiment of an LED package according to the present invention comprises an LED for emitting LED light, and a conversion material remote to said LED for down-converting the wavelength of LED light. The package further comprises a reflector reflecting at least some of the LED light toward the conversion material, the wavelength of at least some of the reflected LED light down-converted by the conversion material.

One embodiment of a method for emitting light according to the present invention comprises emitting primary light from a primary emitter and reflecting at least some of the primary light. The method further comprises converting at least some the reflected primary light. Converted primary light, or a wavelength combination of the converted primary light and the primary light is emitted.

An embodiment of a method for emitting light from an LED package according to the present invention comprises providing an LED, reflector and conversion material, and emitting light from said LED, at least some of the light emitted toward the reflector. The method further comprises reflecting at least some of the LED light toward the conversion material, and converting at least some of said reflected LED light at the conversion material. At least some of the converted reflected LED light is emitted by the LED package.

These and other aspects and advantages of the invention will become apparent from the following detailed description and the accompanying drawings which illustrate by way of example the features of the invention.

BRIEF DESCRIPTION OF THE DRAWINGS

FIG. 6 is a sectional view of another embodiment of an LED package according to the present invention having an inverted LED and hemispheric reflector;

FIG. 7 is a top view of the LED package in FIG. 7;

FIG. 8 is a sectional view of a one embodiment of a multi-LED package according to the present invention;

DETAILED DESCRIPTION OF THE INVENTION

Figure 1:
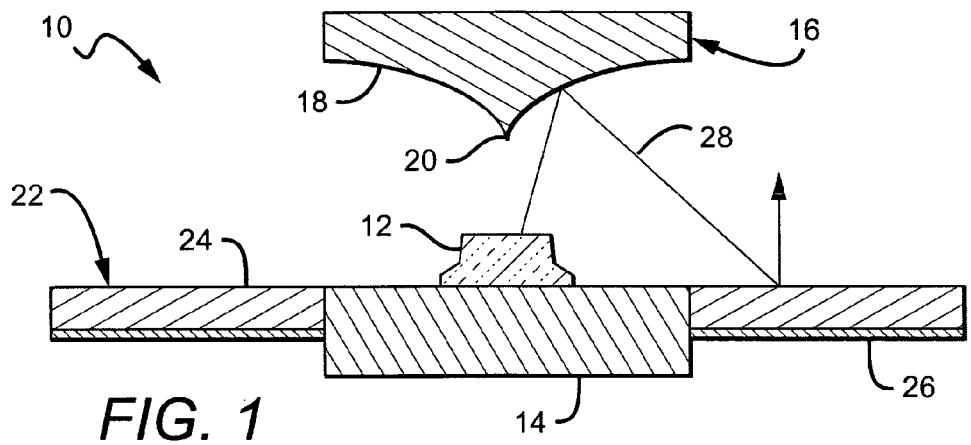
FIG. 1 is a sectional view of one embodiment of an efficient LED package according to the present invention.

The present invention provides an efficient LED package and method for efficiently emitting light from an LED package. The apparatus and methods according to the present invention arrange a reflective conversion material remote to the LED. This approach allows for the down-conversion of the LED light to another wavelength using a relatively thin and dense layer of phosphor materials. This reduces the path length of the light within the converter material and improves the LED package efficiency. The color of LED package emission is controlled by the composition of a reflective converter film, which can comprise both color conversion materials and neutral high reflectivity materials, or a thin phosphor layer on a uniformly coated high reflective (e.g. silver or aluminum mirror) surface possibly in combination with a binder, such as an epoxy or silicone. Different embodiments of the invention incorporate an optical arrangement wherein the light from the conversion material is reflected towards the user and not back reflected towards the package.

The LED packages according to the present invention allow for photons emitted by the LED towards the phosphor to not significantly backscatter light towards low reflectivity, low light extraction elements within the lamp. The scattering and absorption events are thus minimized for all photons and the light extraction from the LED package occurs with a small number of passes. By having the conversion material remote to the LED, the conversion material remains cooler further improving the lamp efficiency. The conversion material can also be pre-fabricated for LED packages according to the present invention, which allows the packages to be reproducible.

To achieve these results, LED packages according to the present invention generally comprise a primary emitter, such as an LED, a reflector and a reflective converter remote to said LED and having a light conversion material. The reflector is positioned so that substantially all LED light reflects from the reflector to the conversion material where the wavelength of at least some of the light is down-converted. This down-converted light, and any remaining LED light transmits from the conversion material. The reflective converter can further comprise reflective materials or a reflective element that reflects the down-converted and any LED light in the desired direction.

It will be understood that when an element or layer is referred to as being "on", "connected to", "coupled to" or "in contact with" another element or layer, it can be directly on, connected or coupled to, or in contact with the other element or layer or intervening elements or layers may be present. In contrast, when an element is referred to as being "directly on," "directly connected to", "directly coupled to" or "directly in contact with" another element or layer, there are no intervening elements or layers present. Likewise, when a first element or layer is referred to as being "in electrical contact with" or "electrically coupled to" a second element or layer, there is an electrical path that permits current flow between the first element or layer and the second element or layer. The electrical path may include capacitors, coupled inductors, and/or other elements that permit current flow even without direct contact between conductive elements.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section.

FIG. 1 shows one embodiment of an LED package 10 according to the present invention that comprises a semiconductor light emitting diode (LED) 12 mounted to a submount 14 using known bonding methods. Although the invention is described herein with reference to semiconductor LED or LEDs, many different emitters can be used. As used herein, the term semiconductor LED may include one or more LEDs, laser diodes and/or other semiconductor devices which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive layers. The semiconductor light emitting device may be gallium nitride-based LEDs or lasers fabricated on a silicon carbide substrate such as those devices manufactured and sold by Cree, Inc. of Durham, N.C., although other emitting devices from other material systems may also be used.

The details of operation and fabrication of conventional LEDs are generally known in the art and are only briefly discussed. Conventional LEDs can be fabricated from a number of material systems by known methods, with a suitable method being fabrication by Metal Organic Chemical Vapor Deposition (MOCVD). LEDs typically have an active region sandwiched between two oppositely doped layers that are either doped p-type or n-type. The top layer of the LED is usually p-type and bottom layer is usually n-type, although LEDs also work if the layers are reversed. The p-type and n-type layers have respective contacts that each have a lead to apply a bias across p- and n-type layers. This bias results in the active layer emitting light from all surfaces of the LED.

The LED 12 can be mounted to submount 14 for mechanical stability using known mounting methods. The submount 14 can comprise electrical circuitry for controlling the relative amount of current or power applied to the LED 12, or to otherwise modify the electric signal applied to the LEDs 12. The submount 14 can also contain components and circuitry to make the lamp resistant to electrostatic shock.

The LED package 10 further comprises a reflector 16 mounted above the LED 12, that can be made of any reflective material, such as a metal, or can be made of a material having one or more surfaces covered with a layer of reflective material such as silver or aluminum. The reflector 16 is generally disc shaped and has a bottom surface 18 facing the LED 12. The bottom surface 18 has a hyperbolic cone shape 20 in the center with curved surfaces toward the edge of the reflector 16. It is understood, however, that the reflector can have many different shapes and sizes and the reflector surfaces can have many different shapes to reflect the light in different directions. The reflector 16 is arranged over the LED 12 with the bottom surface 18 facing the LED 12 with the cone 20 over the LED 12, and in a preferred embodiment over approximately the center of the LED 12 to reflect substantially all primary LED light.

The LED package 10 also has a reflective converter 22 that is arranged remote to the LED at least partially around the LED and submount 14. In the preferred embodiment the reflective converter is around all of the LED and submount and as shown is mounted to the submount 14. It is understood that the reflective converter 22 can be mounted to the LED package in many different ways and at many different locations. In one embodiment, for instance, the reflective converter can be mounted with a space between it and the LED package and at different angles.

In the LED package 10, the reflective converter 22 generally comprises a conversion material 24 mounted on a reflective element 26. The conversion material 24 can be mounted to reflective element 26 using many different methods such as by providing a sheet of conversion material in a binder, with the sheet being cuttable to allow portions to be affixed on the reflective element 26. In other embodiments, the conversion material 24 can be formed on the reflective element 26 using electrophoretic deposition or screen printing, and then held in place by a binder, such as an epoxy. Still other methods include over-molding the phosphor conversion material on the reflective element 26.

In other embodiments, the reflective converter 22 can comprise conversion material 24 with neutral high reflectivity materials mixed in that gives the reflective converter its reflective properties. Many different neutral high reflectivity materials can be used, such as titanium dioxide or barium sulfate. The high reflective material can be used alone or in combination with reflective element 26 to give the reflective converter 22 its optimum reflective properties.

The reflector 16, LED 12 and the reflective converter 22 cooperate so that at least some (and preferably most) of the light from the LED 12 reflects from the reflectors bottom surface 18 toward the reflective converter 22. For example, light along path 28 is emitted from the LED 12 toward the reflector 16, and is reflected toward the reflective converter 22. The conversion material 24 absorbs the light, and re-emits light in a lower frequency spectrum (down-converted) with the light emitting in a Lambertian emission pattern. Down-converted light is emitted forward from the reflective converter 22 towards the user. The reflector and converter geometries are preferably designed such that the majority of the light from the reflective converter is extracted from the lamp towards the user.

The reflector 16 can reflect most of the light toward the reflective converter 22 and the reflective converter 22 can have a thickness or concentration of conversion material 24 so that some of the reflected light is down converted by the conversion material 24, and some of the light passes through the conversion material 24 and is reflected back by the reflective element 26. At least some of the reflected light also passes back through the conversion material without being down-converted, so that some of the LED light is reflected and emits from the reflective converter. In this embodiment, down-converted light and LED light emit back from the reflective converter with the LED package 10 emitting a wavelength combination of the down-converted and LED light.

In other embodiments, the reflective converter 22 can have a thickness or concentration of conversion materials so that substantially all of the reflected light is down-converted by the conversion material 24. In this embodiment, the light emitted back from the reflective converter 22 is primarily in the down-converted wavelength spectrum. The reflector 16 can be sized and positioned to reflect substantially all light from the LED 12 toward the reflective converter 22, so that substantially all light from the LED package is emitted from the reflective converter. In other embodiments, the reflector 16 can be sized to so that it reflects a portion of light from the LED 12 to the reflective converter 22, with the remainder of the LED light passing by the reflector 16 and emitting from the LED package. In this embodiment, the LED 12, reflector 16, and reflective converter 22 can be sized and arranged so that the desired mixing of the primary LED light and the reflected or converted light is emitted from the lamp package.

Many different conversion materials can be used in LED packages according to the present invention. A preferred conversion material comprises one or more phosphors, and the following is a list of some of the phosphors that can be used alone or in combination as the conversion material, grouped by the re-emitted color that each emits following excitation.

Red $Y_2O_2S:Eu^{3+},Bi^{3+}$ $YVO4:Eu^{3+},Bi^{3+}$ $SrS:Eu^{2+}$ $SrY_2S_4:Eu^{2+}$ $CaLa_2S_4:Ce^{3+}$ $(Ca, Sr)S:Eu^{2+}$ $Y_2O_3:Eu^{3+},Bi^{3+}$ $Lu_2O_3:Eu^{3+}$ $(Sr_{2-x}La_x)(Ce_{1-x}Eu_x)O_4$ $Sr_2Ce_{1-x}Eu_xO_4$ $Sr_{2-x}Eu_xCeO_4$ $Sr_2CeO_4$ $SrTiO_3:Pr^{3+},Ga^{3+}$

Orange $SrSiO_3:Eu,Bi$

Yellow/Green $Y_3Al_5O_{12}:Ce^{3+}$ $YBO_3:Ce^{3+},Tb^{3+}$ $BaMgAl_{10}O_{17}:Eu^{2+},Mn^{2+}$ $(Sr,Ca,Ba)(Al,Ga)_2S_4:Eu^{2+}$ $ZnS:Cu^+,Al^{3+}$ $LaPO_4:Ce,Tb$ $Ca_8Mg(SiO_4)_4Cl_2:Eu^{2+},Mn^{2+}$ $((Gd,Y,Lu,Se,La,Sm)_3(Al,Ga,In)_5O_{12}:Ce^{3+}$ $((Gd,Y)_{1-x}Sm_x)_3(Al_{1-y}Ga_y)_5O_{12}^-:Ce^{3+}$ $(Y_{1-p-q-r}Gd_pCe_qSm_r)_3(Al_{1-y}Ga_y)_5O_{12}$ $Y_3(Al_{1-s}Ga_s)_5O_{12}:Ce^{3+}$ $(Y,Ga,La)_3Al_5O_{12}:Ce^{3+}$ $Gd_3In_5O_{12}:Ce^{3+}$ $(Gd,Y)_3Al_5O_{12}:Ce^{3+},Pr^{3+}$ $Ba_2(Mg,Zn)Si_2O_7:Eu^{2+}$ $(Y,Ca,Sr)_3(Al,Ga,Si)_5(O,S)_{12}$ $Gd_{0.46}Sr_{0.31}Al_{1.23}O_xF_{1.38}:Eu^{2+}{}_{0.06}$ $(Ba_{1-x-y}Sr_xCa_y)SiO_4:Eu$ $Ba_2SiO_4:Eu^{2+}$ Blue $ZnS:Ag,Al$ Combined Yellow/Red $Y_3Al_5O_{12}:Ce^{3+},Pr^{3+}$ White $SrS:Eu^{2+},Ce^+,K^+$ From the list above, the following phosphors are preferred for use as the conversion material based on certain desirable characteristic. Each is excited in the blue and/or UV wavelength spectrum, provides a desirable peak emission, has efficient light conversion, and has acceptable Stokes shift.

Red $Lu_2O_3:Eu^{3+}$ $(Sr_{2-x}La_x)(Ce_{1-x}Eu_x)O_4$ $Sr_2Ce_{1-x}Eu_xO_4$ $Sr_{2-x}Eu_xCeO_4$ $SrTiO_3:Pr^{3+},Ga^{3+}$

Yellow/Green $Y_3Al_5O_{12}:Ce^{3+}$ $(Sr,Ca,Ba)(Al,Ga)_2S_4:Eu^{2+}$ $Ba_2(Mg,Zn)Si_2O_7:Eu^{2+}$ $Gd_{0.46}Sr_{0.31}Al_{1.23}O_xF_{1.38}:Eu^{2+}{}_{0.06}$ $(Ba_{1-x-y}Sr_xCa_y)SiO_4:Eu$ $Ba_2SiO_4:Eu^{2+}$ To further improve the uniformity of light emission from the covered LED, the conversion material 24 can also include scattering particles to randomly refract the light as it passes through. To effectively scatter light, the diameter of the scattering particles should be approximately one half of the wavelength of the light being scattered. Light from the LEDs pass through the particles and is refracted to mix and spread the light. Preferred scattering particles do not substantially absorb LED light and have a substantially different index of refraction than the material in which it is embedded (for example, epoxy). In one embodiment the scattering particles should have an index of refraction higher than the material in which it is embedded. Suitable scattering particles can be made of titanium oxide ($TiO_2$) which has a high index of refraction (n=2.6 to 2.9). Other materials such as porous silica, which has small air voids or pores could also be used as to scatter the light.

As mentioned above, the LED can emit light in different wavelength spectrums in LED packages according to the present invention. In one embodiment, the LED 12 can emit light in a blue wavelength spectrum and the conversion material 24 can contain phosphors that down-converts blue light and re-emit yellow light. The LED package 10 can then emit a white light combination of blue and yellow light. In other embodiments, the conversion material can absorb all the blue LED light and emit a monochromatic yellow light. If a different type of phosphor is used, the package 10 can re-emit different monochromatic light, such as green. In another embodiment, the LED can emit in the UV wavelength spectrum and the conversion material can contain different phosphors that down-convert UV light and emit different wavelengths of light that can combine to white light or other wavelengths of light.

In embodiments using different phosphors, the phosphors can be mixed evenly throughout the conversion material or the conversion material can have different regions where the concentration of certain phosphors can be greater. In still other embodiments, the conversion material can be divided into regions having one of the different phosphors. It is understood that at least some segments of the light path from the LED 12 to the extraction point from the lamp can include encapsulation materials like epoxies or silicones. They can be arranged continuously, or in lens or thin film form.

Figure 2:
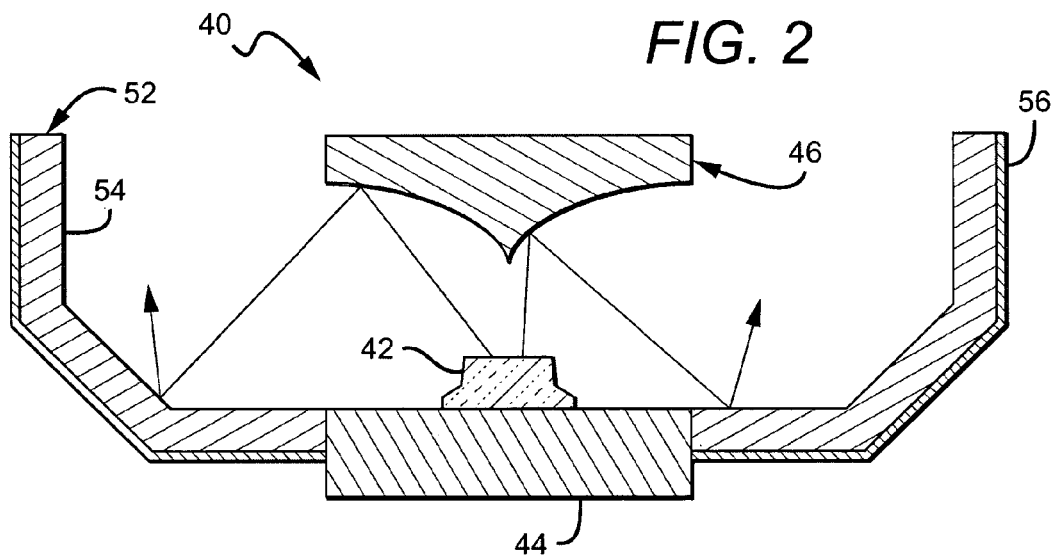
FIG. 2 is a sectional view of another embodiment of an LED package according to the present invention.

FIG. 2 shows another embodiment of an LED package 40 according to the present invention having an LED 42 mounted to a submount 44, both of which are similar to the LED 12 and submount 14 shown in FIG. 1 and described above. The LED package also comprises a reflector 46 mounted over the LED 42 with the reflector made of a reflective material and arranged to reflect light from the LED as described above. The LED package further comprises a reflective converter 52, having a conversion material 54 similar to the conversion material 24 shown in FIG. 1 and described above. The conversion material 54 can comprise many different materials, including one or more of the phosphors listed above. The conversion material 54 can also comprise neutral reflective elements or scattering particles as described above. The reflective converter 52 can also have a reflective element 56, particularly in those embodiments not having neutral reflective elements. The reflective converter 52 is formed in a cup around the LED 52, submount 44 and reflector 46 combination.

LED package 40 operates in much the same way as LED package 10 in FIG. 1, with light from the LED 42 reflected from reflector 46 to the reflective converter 52. In different embodiments, all or some of the light can be absorbed by the conversion material and re-emitted at a down-converted frequency spectrum. In the embodiments where some of the light is absorbed, the LED package 40 emits a wavelength combination of the LED light reflected from the reflective element 56 and the down-converted light. In those embodiments where all of the LED light is absorbed by the conversion material, and substantially all of LED light is reflected by the reflector 46, the LED package 40 emits only the down-converted light. In the embodiments where all of the reflected light is absorbed, but not all of the LED light is reflected by the reflector 46, the LED package 40 emits a wavelength combination of the down-converted light and non-reflected LED light that passes by the reflector 46.

The shape of the reflective converter 52 provides a more directed beam of light out the opening in the reflective converter 52. Its design together with the shape of the reflector 46 can allow for capturing essentially all light reflected by the reflector 46 onto the reflective converter 52. Different shapes can be used for the reflective converter 52 such as hemispheric or box-shaped with an opening, with the LED 42 arranged at the base of the hemisphere or box.

Figure 3:
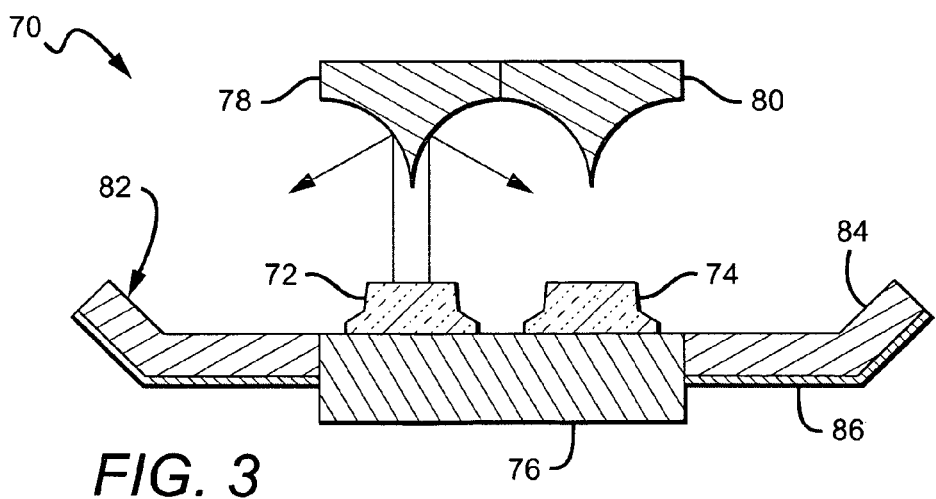
FIG. 3 is a sectional view of another embodiment of an LED package according to the present invention having more than one reflector.

It is understood that LED packages according to the present invention can have more than one LED and more than one reflector. FIG. 3 shows another embodiment of an LED package 70 according to the present invention having first and second LEDs 72, 74 mounted to submount 76, both of which are similar to the LEDs and submounts described above. The LED package 70 further comprises first and second reflectors 78, 80, with the first reflector arranged over the first LED 72 and the second reflector 80 arranged over the second LED 74. In other embodiments a single reflector can be arranged over the LEDs 72, 74.

The LED package 70 further comprises a reflective converter 82, comprising a converter material 84 and reflective element 86, both of which are similar to the converter materials and reflective elements above and both of which can comprise the same materials. The reflective converter 82 is not flat, but instead has an angled portion to provide some directionality to the light emitted from the package 70.

In operation, light from the LEDs 72, 74 reflects from the reflectors 78, 80 to the reflective converter 82. The light can be fully or partially absorbed by the conversion material 84 and down-converted. When partially down-converted the LED package 70 emits a combination of light from the conversion material 84 and the LEDs 72, 74. When the light is fully absorbed the LED package 10 can emit light only from the conversion material 84 or from the conversion material 84 and the LEDs 72, 74 depending on whether the reflectors 78, 80 reflect all or some of the light as described above. This embodiment provides for the combined emission of two LEDs with the emission from the conversion material 84.

Figure 4:
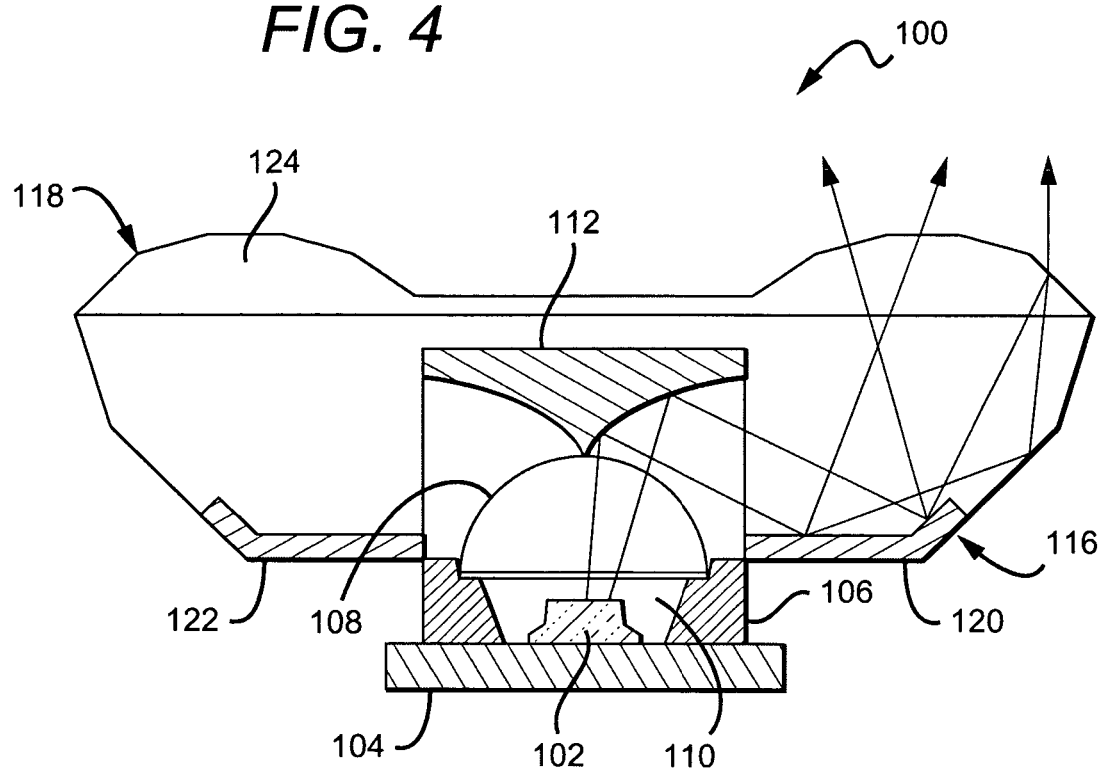
FIG. 4 is a sectional view of one embodiment of an LED package according to the present invention having an optical element for beam shaping.

FIG. 4 shows another embodiment of an LED package 100 according to the present invention having additional features to aid in beam shaping. The LED package 100 comprises an LED 102 mounted to a submount 104, although the package 100 can have more than one LED. A cup 106 is mounted to the submount 104, preferably around the LED 102. A hemispheric lens 108 is mounted to the cup 106, over the LED 102. A space 110 remains between the LED 102 and the bottom of the lens 108 that is filled with a transparent or light transmitting material such as a clear epoxy or silicone. A reflector 112 is arranged over the LED 102 with the lens arranged to focus substantially all of the LED light on the reflector 112. The reflector 112 can be mounted over the LED 102 using many different mounting apparatus or can be affixed to the optical element 118.

The LED package further comprises a reflective converter 116 mounted on the lower surface of optical element 118. The reflective converter 116 comprises a conversion material 120 that can be any one or more of the materials described above. To make the conversion material 120 reflective it can comprise neutral reflective elements in one embodiment, or as shown in FIG. 4, a reflective element 122 can be included behind the conversion material 120. In the package 100 the conversion material does not extend to cover the inside surface of the optical element 118, but in other embodiments it can extend farther or less than shown. In some embodiments where the conversion material does not cover the inside surface, the reflective element 122 can continue past where the conversion material 120 ends. The optical element 118 has a beam focusing feature 124 to shape the light emitting from the package 100.

The package 100 operates in much the same way as the embodiments described above, with light from the LED 102 reflecting from the reflector 112 to the reflective converter. All or some of the LED light is down-converted and as described above, different embodiments of the LED package 100 can emit only down-converted light or wavelength combinations of the down-converted and LED light.

Figure 5:
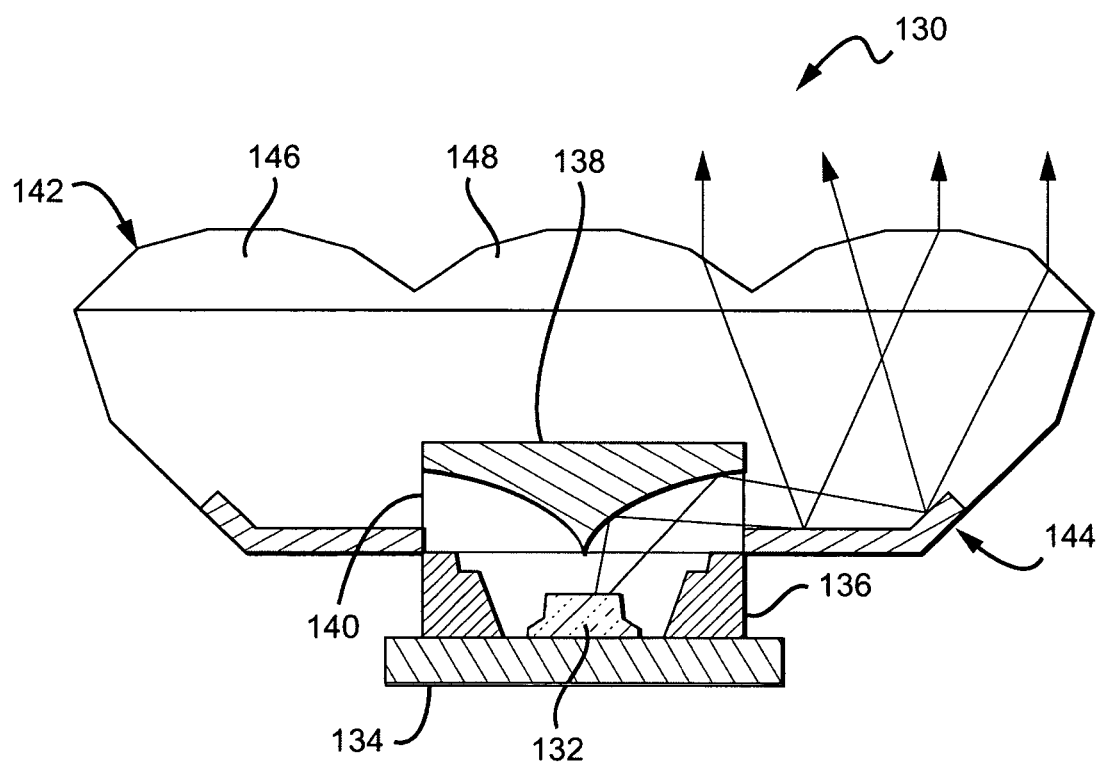
FIG. 5 is a sectional view of another embodiment of an LED package according to the present invention having an optical element for beam shaping.

FIG. 5 shows another embodiment of an LED package 130 according to the present invention having many features similar to the LED package 100 described above and shown in FIG. 4, and operating in similar way. The package comprises an LED 132 mounted to a submount 134, with a cup 136 on the submount 134 around the LED 132. A reflector 138 is mounted above the LED 132. The LED package 130 further comprises an optical element 142, with a reflective converter 144.

The cup 136 is a reflective element that allows for the package 130 to be arranged without a lens. The reflector 138 can be mounted closer to the LED 132 and the reflective converter 144 can be closer to the reflector 138 thus allowing for essentially all LED light being reflected towards the reflective converter 144. The space between the LED 132 and the reflector 138 is at least partially filled with encapsulation material like epoxy or silicone. The optical element 142 has beam focusing features 146 similar to beam focusing feature 124 in FIG. 4.

The LED and reflector can be arranged in many different ways according to the present invention. FIGS. 6 and 7 show another embodiment of an LED package 160 according to the present invention wherein the LED is inverted over a reflector converter. The package 160 includes an LED 162 that is similar to the LED 102 in FIG. 4, with the LED 162 mounted to a submount 164. A cup 166 is mounted to the submount 164 around the LED 162, and an optional lens 168 is mounted to the cup 166, over the LED 162. The lens 168 focuses or shapes light from the LED 162.

The LED package 160 further comprises a reflective converter 170, that as shown is hemispheric shaped. In other embodiments, the reflective converter 170 can have different shapes such as planar or box-shaped, and can have any combination of planar surfaces and curved surfaces. The reflective converter 170 further comprises a converter material 172 that can contain one or more of the phosphors, neutral reflective materials, and scattering particles described above. The reflective converter can also comprise a reflective element 174 to reflect down-converted and/or LED light.

The LED 162 is inverted over the reflective converter 170 with the LED light directed toward the reflective converter 170. The LED 162 can be mounted in place using many different methods and apparatus, with a suitable method being suspension elements 176 spanning between the submount 164 and the reflective converter 170. The LED is preferably aligned with the longitudinal axis of the reflective converter 170. The suspension elements 176 can be used as heat conductors to draw heat away from the submount 164 and LED 162, can incorporate thermal management elements, and electrical elements to power the LED. Similarly, the reflective converter can also have thermal management elements. In this embodiment essentially all LED light is directed towards the reflective converter 170, and as a result, the need for a primary reflector (like reflector 46 in FIG. 4) is eliminated.

In operation, light from the LED 162 is directed toward the reflective converter 170 where some or all of the LED light is down-converted. In those embodiments where all the LED light is down-converted, the down-converted light is reflected back in the direction of the LED 162 with the LED package 160 emitting down-converted light. In the embodiments where some of the light is down-converted, the down-converted and LED light is reflected back in the direction of the LED 162 with the LED package 160 emitting a wavelength combination of the down-converted and LED light.

The LED packages described above can also be arranged in a device having multiple LEDs and/or LED packages. FIG. 8 shows one embodiment of a multiple LED package 190 according to the present invention comprising a circuit board 192 with multiple LEDs 194 mounted to it. The LEDs 194 can be mounted to the circuit board 192 in many different ways, but are preferably mounted to a submount 196 that is in turn mounted to the circuit board 192. The circuit board 192 preferably has conductive traces that allow for a signal to be applied to the circuit board 192 and conducted to the LEDs 194 causing them to emit light.

Multiple reflective converters 198 are also mounted to the circuit board, with each of the reflective converters 198 between adjacent LEDs. Each if the reflective converters 198 can comprise a conversion material and a reflective element as described above. The package 190 further comprises multiple reflectors 200 each of which is arranged over one of the LED 194 to reflect LED light to the reflective converters 198. The package 190 can also comprise a diffuser/lens element 202 mounted over the circuit board 192.

In operation, a signal is applied to the circuit board 192 causing the LEDs 194 to emit light. Light from the LEDs 194 reflects from the reflectors 200 toward the reflective converters 198, where all or some of the light is down-converted. The down-converted (and LED light) is reflected at the reflective converted to the diffuser/lens element where diffused in the case of a diffuser, or focused in the case of a lens.

It is understood that the package 190 can be arranged in many different ways, with different numbers of LEDs and reflective converters. It is also understood that the reflectors and the reflective converters can have many different shapes and sizes according to the present invention. The package 190 allows multiple LEDs to be used together to form light sources of different shapes such as elongated, circular. etc.

It is understood that the LED packages described above can be manufactured using different methods known in the art. Accordingly, the specifics of the fabrication methods have only been discussed briefly herein.

Figure 9:
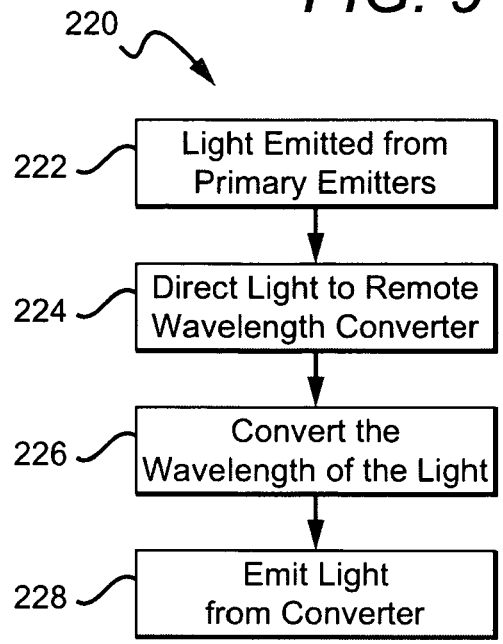
FIG. 9 is a flow diagram for one embodiment of a method for generating light according to the present invention.

FIG. 9 shows one embodiment of a method 220 for efficiently emitting light according to the present invention, and although certain steps of methods are shown in a particular order it is understood that other methods according to the present invention can have different steps in different order. In 222 light is first emitted from a primary emitter, and in 224 the emitted light is directed toward a wavelength converter, such as by a reflector. The light is preferably directed (reflected) so that most of it is not reflected back toward the primary emitter. In 226 the wavelength of at least some of the primary light is converted at a wavelength converter that is located remote to the primary emitter. In 228 light is emitted from the wavelength converter that comprises at least all down-converted light or is a wavelength combination of the down-converted light and primary emitter light.

Figure 10:
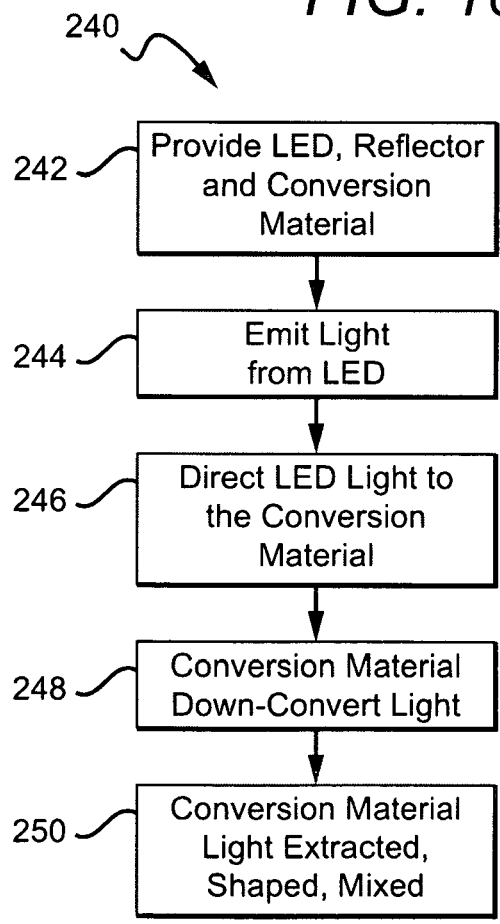
FIG. 10 is a flow diagram for another embodiment of a method for generating light according to the present invention.

FIG. 10 shows another embodiment of a method 240 for efficiently emitting light according to the present invention. In 242 an LED, reflector and conversion material are provided, with the conversion material preferably being remote to the LED. In some embodiments the conversion material can be remote to the LED as described above and shown in FIGS. 1-7. In 244 light is emitted from LED. In 246 at least some of the light from the LED is directed toward the conversion material with most of the light not reflected back toward to LED. In 248, the conversion material down-converts at least some of the light and emits either all down-converted light, or emits a wavelength combination of down-converted light and primary LED light. In 250 the down-converted and primary light or all down-converted light is extracted from the lamp or beam shaped into a desired emission angle. In the case of mixed down-conversion and primary light emission a mixing element can be added to 250 to ensure a uniform beam color.

Although the present invention has been described in considerable detail with reference to certain preferred configurations thereof, other versions are possible. As mentioned above, the LED packages can be arranged in many different ways with different LEDs that emit at different colors. In those embodiments where one emitter is described as providing light in a particular wavelength spectrum, two or more emitters can be used. The conversion materials described above can use many different types of material that absorb different wavelengths of light and re-emit different wavelengths beyond those described above. Therefore, the spirit and scope of the appended claims should not be limited to their preferred versions contained therein.

We claim:

1. A light emitting diode (LED) package, comprising:
   an LED for emitting LED light;
   first and second reflectors;
   a conversion material on said second reflector and remote to said LED for converting the wavelength of said LED light; and
   wherein said first reflector is remote to said conversion material and to said LED and reflects at least some of said LED light toward said conversion material and said second reflector, said conversion material converting the wavelength of at least some of said reflected LED light.

2. The LED package of claim 1, wherein said conversion material down-converts substantially all of said reflected LED light, said emitter package emitting primarily down-converted LED light.

3. The LED package of claim 1, wherein said conversion material down-converts some of said reflected LED light, said emitter package emitting a wavelength combination of said LED light and down-converted LED light.

4. The LED package of claim 1, wherein said conversion material comprises one or more phosphors.

5. The LED package of claim 1, wherein said conversion material further comprises a reflective element to reflect said down-converted converted LED light and LED light not down-converted.

6. The LED package of claim 1, wherein said first reflector reflects substantially all of said LED light away from said LED.

7. The LED package of claim 1, wherein said conversion material contains scattering particles.

8. The LED package of claim 1, wherein said conversion material comprises neutral reflective elements to reflect said converted reflected LED light and any reflected light not converted.

9. The LED package of claim 1, further comprising an optical element for light extraction or beam shaping or both.

10. An emitter package, comprising:
a primary emitter emitting light;
a reflective converter remote to said primary emitter capable of converting the wavelength of said emitter light; and
a reflector reflecting at least some of said emitter light toward said reflective converter, the wavelength of at least some of said reflected light converted by said reflective converter.

11. The emitter package of claim 10, wherein said reflective converter comprises one or more phosphors that down convert said emitter light.

12. The emitter package of claim 10, wherein said reflective converter further comprises a reflective element to reflect said converted reflected light and any reflected light not converted.

13. The emitter package of claim 10, wherein said reflector reflects substantially all of said light away from said primary emitter.

14. The emitter package of claim 10, wherein said reflective converter contains scattering particles.

15. The emitter package of claim 10, wherein said reflective converter comprises neutral reflective elements to reflect said converted reflected light and any reflected light not converted.

16. A method for emitting light, comprising;
emitting primary light from a primary emitter;
reflecting at least some of said primary light away from said primary emitter using a first reflector;
converting at least some said reflected primary light using a conversion material;
reflecting at least some of said converted primary light using a second reflector; and
emitting said converted primary light or a wavelength combination of said converted primary light and said primary light.

17. The method of claim 16, wherein said substantially all of said reflected primary light is converted and wherein converted primary light is emitted.

18. The method of claim 16, wherein some of said reflected primary light is converted, and wherein a wavelength combination of said converted primary light and said primary light is emitted.

19. The method of claim 16, further comprising reflecting said converted reflected primary light and any reflected primary light not converted.

20. A method for emitting light, comprising;
emitting primary light from a primary emitter;
redirecting at least some of said primary light with a first reflector towards a second reflector, wherein said second reflector comprises a converter;
converting at least some said redirected primary light; and
emitting said converted primary light or a wavelength combination of said converted primary light and said primary light.

21. A method for emitting light from a light emitting diode (LED) package, comprising:
providing an LED, a first reflector, a second reflector and conversion material;
emitting light from said LED, at least some of said light emitted toward said first reflector;
reflecting at least some of said LED light toward said conversion material using said first reflector;
converting at least some of said reflected LED light at said conversion material using said conversion material;
reflecting at least some of said converted LED light at said second reflector; and
emitting at least some of said converted reflected LED light.

22. The method of claim 21, wherein substantially all of said reflected LED light is converted and wherein converted reflected LED light is primarily emitted.

23. The method of claim 21, wherein some of said reflected LED light is converted, and wherein a wavelength combination of said converted reflected LED light and said reflected LED light is emitted.

24. The method of claim 21, further comprising reflecting said converted reflected LED light and any reflected LED light not converted.

25. The method of claim 21, wherein said converting comprises wavelength conversion.

26. A light emitting diode (LED) package, comprising:
an LED mounted to a submount and capable of emitting LED light;
a reflector arranged to reflect at least some of said LED light; and
a reflective converter remote to said LED and arranged to accept at least some of said reflected LED light, down-convert the wavelength of at least some of said reflected LED light, and reflect said down-converted light and any reflected LED light not down-converted.

27. The LED package of claim 26, wherein said reflective converter comprises a conversion material and a reflective element.

28. The LED package of claim 26, wherein said conversion material comprises one or more phosphors.

29. The LED package of claim 26, wherein said reflector reflects substantially all of said LED light away from said LED.

30. The LED package of claim 26, further comprising an optical element.

31. The LED package of claim 26, wherein said reflective converter is mounted to said submount.

32. A light emitting diode (LED) package, comprising:
an LED for emitting LED light;
a conversion material remote to said LED for converting the wavelength of said LED light; and
a reflector arranged to reflect said LED light toward said conversion material, said conversion material arranged to convert the wavelength of at least some of said reflected LED light and to reflect said light out of said LED package.

33. A light emitting diode (LED) package, comprising:
an LED mounted to a submount and capable of emitting LED light;
a reflector arranged to reflect at least some of said LED light; and
a reflective converter remote to said LED and arranged to accept at least some of said reflected LED light, down-convert the wavelength of at least some of said reflected LED light, and reflect said down-converted light and any reflected LED light not down-converted, wherein said reflective converter comprises a plurality of light scattering particles.

34. The emitter package of claim 33, wherein said reflective converter comprises one or more phosphors that down convert at least some of said LED light.

35. The emitter package of claim 33, wherein said reflective converter further comprises a reflective element said converted light or combination of converted light or said LED extracted by reflecting from said reflective element.

36. The emitter package of claim 35, wherein said LED is arranged such that said reflector reflects at least some of said light toward said LED.

37. The emitter package of claim 35, wherein said reflective converter contains scattering particles.

38. The emitter package of claim 35, wherein said reflective converter comprises neutral reflective elements said converted light or combination of converted light previously presented or said LED light extracted by reflecting from said neutral reflective elements.

39. A light emitting diode package (LED), comprising:
an LED mounted on a submount;
a bowl-shaped reflective converter; and
at least one suspension element connecting said submount to said reflective converter such that said LED and said submount are suspended at an open end of said reflective converter, said LED disposed to emit light toward said reflective converter.

40. The LED package of claim 39, wherein said reflective converter is arranged to receive and convert the wavelength of substantially all LED light, said LED package emitting primarily converted LED light.

41. The LED package of claim 39, wherein said reflective converter is arranged to receive and convert some LED light, said emitter package emitting a wavelength combination of said LED light and converted LED light.

42. The LED package claim 39, wherein said reflective converter comprises phosphor.

43. The LED package of claim 39, wherein said reflective converter comprises neutral scattering particles.

44. The LED package of claim 39, wherein said LED is arranged along a longitudinal axis of said reflective converter.

45. The LED package of claim 39, wherein said suspension elements comprise heat conductors to draw heat away from said submount.

46. The LED package of claim 39, wherein said suspension elements house electrical elements to power said LED.

* * * * *